United States Patent [19]

So et al.

[11] Patent Number: 5,853,905
[45] Date of Patent: Dec. 29, 1998

[54] EFFICIENT SINGLE LAYER ELECTROLUMINESCENT DEVICE

[75] Inventors: Franky So, Tempe; Chan-Long Shieh, Paradise Valley, both of Ariz.; Hsing-Chung Lee, Calabasas, Calif.; Song Q. Shi, Phoenix, Ariz.

[73] Assignee: Motorola, Inc., Schaumburg, Ill.

[21] Appl. No.: 925,375

[22] Filed: Sep. 8, 1997

[51] Int. Cl.$^6$ .............................. B32B 9/00; H05B 33/14
[52] U.S. Cl. ............................. 428/690; 257/40; 313/503; 313/504; 428/917; 564/305; D18/26; 252/583
[58] Field of Search .................................... 428/917, 690; D18/26; 313/503, 504; 257/40; 564/305; 252/583

[56] References Cited

U.S. PATENT DOCUMENTS 4,775,820  10/1988  Eguchi et al. ........................... 313/504

FOREIGN PATENT DOCUMENTS 8-249934   9/1996   Japan .
8-292586  11/1996   Japan .

*Primary Examiner*—Shailendra Kumar
*Attorney, Agent, or Firm*—Eugene A. Parsons

[57] ABSTRACT

An electroluminescent device is composed of a body of small molecule organic material(s) sandwiched between a first and a second electrode, wherein a layer of first insulative material is placed between the body of small molecule organic material(s) and the first electrode, and an optional layer of second insulative material is placed between the body of small molecule organic material(s) and the second electrode. The layer of first insulative material has a thickness which allows first carriers from the first electrode to tunnel therethrough and the second insulative material has a thickness which allows second carriers from the second electrode to tunnel therethrough. Further, the layer of first insulative material provides a barrier to the second carriers and the layer of second insulative material provides a barrier to the first carriers.

34 Claims, 1 Drawing Sheet

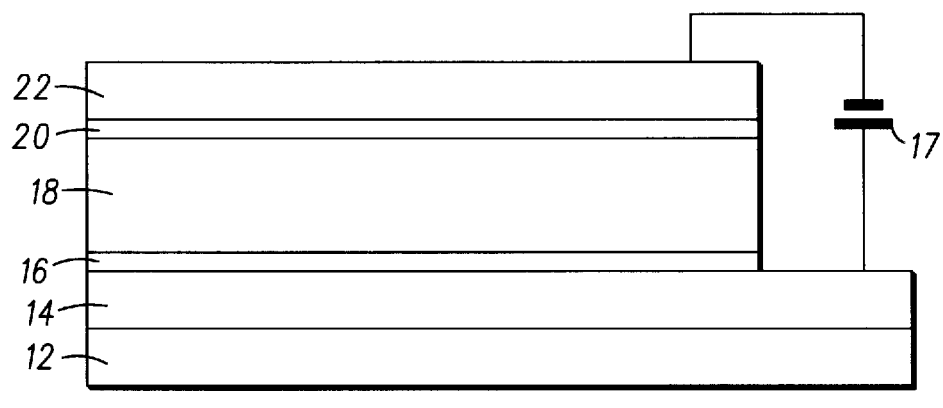

EFFICIENT SINGLE LAYER ELECTROLUMINESCENT DEVICE

FIELD OF THE INVENTION

The present invention pertains to electroluminescent devices and more particularly to structure for improving the efficiency of electroluminescent devices.

BACKGROUND OF THE INVENTION

Organic electroluminescent (EL) devices are generally composed of three layers of organic materials sandwiched between transparent and metallic electrodes, the three layers including an electron transporting layer, an emissive layer and a hole transporting layer. Organic EL devices are attractive owing to the merits of low driving voltage and capability for full color flat emissive displays. Though significant lifetime has been achieved in the prior art (See U.S. Pat. No. 4,720,432), further improvement is needed for applications where high brightness is required. Among other things, device structure modification to enhance carrier injection efficiency and confine carriers in the layers of organic materials to increase the recombination probability is essential to improve the lifetime of organic electroluminescent devices.

In an article by Tang et al., entitled "Fabrication and Electroluminescence of Double-Layered Organic Light-Emitting Diodes with the $Al_2O_3$/Al Cathode", *Appl. Phys. Lett.*, vol. 70, No. 10, pp. 1233–1235, 10 Mar. 1997, a buffer layer of $Al_2O_3$ is positioned between a layer of $Alq_3$ (electron transporting and emissive layer) and an aluminum electrode (cathode). The buffer layer provides enhanced tunneling and removes exciton-quenching gap states that are intrinsic to the $Alq_3$/Al interface.

An article by Parker et al., entitled "Fabrication of Polymer Light-Emitting Diodes Using Doped Silicon Electrodes", Appl, Phys. Lett., Vol. 64, No. 14, pp. 1774–1776, 4 Apr. 1994, discloses the use of a doped silicon electrode and an $SiO_2$ layer on the polymer diode so as to enable the fabrication of polymer LEDs directly on a silicon substrate and the consequent integration of the polymer LEDs into silicon based integrated circuitry.

Generally, there is a need to simplify the structure of an organic electroluminescent device so that it can be fabricated inexpensively. However the simplification should not come at the expense of the lifetime and efficiency of the device. Also, the elimination of the interface between electron transporting and hole transporting layers will result in an electroluminescent device with improved reliability.

It is a purpose of the present invention to provide a new and simplified electroluminescent device.

It is another purpose of the present invention to provide a new and simplified electroluminescent device with high efficiency.

It is still another purpose of the present invention to provide a new and simplified electroluminescent device with improved stability.

It is a further purpose of the present invention to provide a new and improved electroluminescent device which can be fabricated inexpensively.

SUMMARY OF THE INVENTION

The above problems and others are at least partially solved and the above purposes and others are realized in an electroluminescent device including a body of small molecule organic material(s) sandwiched between a first electrode and a second electrode, a layer of first insulative material placed between the body of small molecule organic material(s) and the first electrode, and optionally, a layer of second insulative material placed between the body of small molecule organic material(s) and the second electrode.

The layer of first insulative material has a thickness which allows first carriers from the first electrode to tunnel therethrough to enter the body of small organic molecule organic material(s) when an electrical bias is applied between the first and second electrodes. The optional second insulative material also has a thickness which allows second carriers from the second electrode to tunnel therethrough to enter the body of small organic molecule organic material(s) when an electrical bias is applied between the first and second electrodes.

Further, the layer of first insulating material provides a barrier to second carriers injected from the second electrode, thus confining the second carriers in the single body of small molecule organic material(s). On the other hand, the layer of second insulating material provides a barrier to first carriers injected from the first electrode, thus confining the first carriers in the single body of small molecule organic material(s). The confinement of the first and the second carriers in the single body of small molecule organic materials provides a maximum probability for the first and second carriers to recombine radiatively.

Still further, fluorescent dyes or pigments can be introduced into the single body of small molecule organic material(s) to act as emitting centers.

BRIEF DESCRIPTION OF THE DRAWINGS

The single FIGURE is a simplified sectional view of an organic electroluminescent device in accordance with the present invention.

DESCRIPTION OF THE PREFERRED EMBODIMENT

Turning now to the single FIGURE, a simplified sectional view of an organic electroluminescent (EL) device 10 in accordance with the present invention is illustrated. Device 10 is fabricated upon a substrate 12 which, in this preferred embodiment, is transparent and may be fabricated of any of the number of known materials employed in the art. For example, substrate 12 may be fabricated of a glass, such as a Corning 7059 glass, transparent plastic substrates made of polyolefins, polyethersulfones, polyarylates, etc. In one preferred embodiment, substrate 12 is fabricated of glass of a quality good for flat panel display applications.

Deposited atop substrate 12 is a first electrode 14, which is electrically conductive and optically transparent or semi-transparent. Several materials may be advantageously employed as first electrode 14 for an organic EL device. Examples of materials include conductive metal oxides such as indium oxide, indium-tin oxide (ITO), zinc oxide, zinc-tin oxide, conductive transparent polymers such as polyaniline. Alternatively, electrode 14 may be fabricated of a semi-transparent metal, examples of which include a thin layer (<500 Å) of gold, copper, silver, and combinations thereof. In one preferred embodiment, electrode 14 is fabricated of ITO or zinc oxide.

Thereafter, atop the first electrode 14 is deposited a thin insulative layer 16. The thin insulative layer 16 is selected so that it allows the easy tunneling of holes from electrode 14 to an organic electroluminescent medium layer, as will be explained shortly hereafter. Meantime, layer 16 also provides a barrier to electrons tending to move from medium 18 into electrode 14. Generally, insulative layer 16 has a thickness less than 100 Å and preferably less than 50 Å. Insulative layer 16 is formed of an insulative, wide bandgap inorganic or organic material. Examples of materials that can be utilized in the formation of insulating layer 16 are polymethylmethacrylate, polyimide, perfluoropolymers, LiF, AlF3, CaF2, MgF2, diamond, diamond like carbon, SiO2, MgO, $Al_2O_3$, or the like.

Thereafter deposited atop insulating layer 16 is a single body of organic electroluminescent medium 18 where light emission takes place. In this embodiment, organic electroluminescent medium 18 is composed of a continuous organic medium without heterojunctions. Generally, medium 18 has a bandgap in a range from 1.5 to 3.5 and preferably in a range from 1.8 to 3. It is preferred that medium 18 is made of small molecule organic material(s). The traditional unipolar carrier transporting materials such as hole transporting materials and electron transporting materials known to those skilled in the art can be used as the organic electruluminescent medium.

The following tertiary aromatic amines are examples of hole transporting materials that satisfy the present invention as the organic electroluminescent medium.

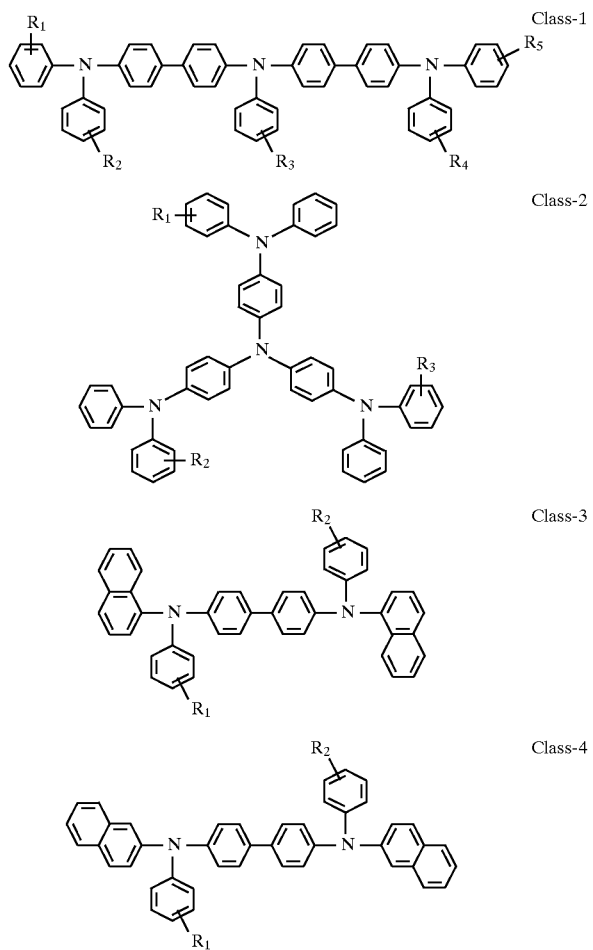

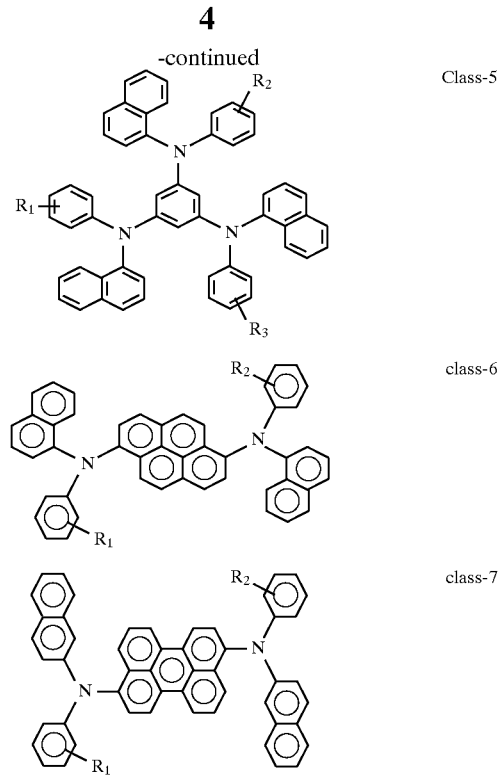

Where $R_1$, $R_2$, $R_3$, $R_4$ and $R_5$ are independently selected from alkyl groups, alkoxy groups, alkylamine groups, aryl groups, aryloxy groups, arylamine groups and halogen such as bromide, chloride, and fluoride; $R_1$, $R_2$, $R_3$, $R_4$ and $R_5$ may also be independently a fused aromatic ring.

The electron transporting materials that can be used as the organic electroluminescent medium include metal chelated oxinoid compounds disclosed in U.S. Pat. No. 4,769,292, U.S. Pat. No. 5,529,853, U.S. Pat. No. 5,151,629, U.S. Pat. No. 5,150,006 and organometallic complexes disclosed in a pending U.S. Patent Application entitled "NEW ORGANOMETALLIC COMPLEXES FOR USE IN LIGHT EMITTING DEVICES", filed 12 Sep. 1994, bearing Ser. No. 08/304,451, and assigned to the same assignee. Examples of the preferred host emitting matrix materials are selected from tris(8-quinolinol) aluminum, bis(10-oxo-benzo[h]quinoline beryllium, bis(2-(2-oxy-phenyl)benzoxazole) zinc, bis(2-(2-oxy-phenyl)benzothiazole) zinc, Bis(2-methyl-8-quinolinolato)aluminum-μ-oxo-bis (2-methyl-8-quinolinolato)aluminum, Bis(2-methyl-8-quinolinolato)(ortho-cresolato)aluminum.

In this embodiment, bipolar materials defined as having the capability of transporting both electrons and holes can also be used as the organic electroluminescent medium 18. One of the preferred bipolar materials has a general formula of $A_xB_y$, where A is a component capable of transporting electrons, B is a component capable of transporting holes, x represents the content of the A component in the $A_xB_y$ medium with a value ranging from 0 adjacent the first electrode to 100% adjacent the second electrode (to be described hereafter), and y represents the content of the B component in the $A_xB_y$ medium with a value ranging from 0 adjacent the second electrode to 100% adjacent the first electrode. The relationship between x and y is: x=100%−y. While the variations of X and Y across medium 18 will generally be substantially linear, it will be understood by those skilled in the art that variations other than linear may be incorporated in specific applications.

In this embodiment, it is preferred that in the direction from the first electrode to the second electrode in $A_xB_y$ medium 18 the content of the A component (x) gradually increases while the content of the B component (y) gradually decreases. One extreme case will be that the content of the A component increases from 0% to 100%, meantime the content of the B component decreases from 100% to 0% in the direction from layer 16 to layer 20. Of course, it is also possible to start $A_xB_y$ with x being a fraction of a percent (e.g. x=0.1%, y=99.9%) and end up with y being a fraction of a percent (e.g. x=99.9%, y=0.1%). The rates of increase of the A component and decrease of the B component can be controlled by relative evaporation or sputtering rates of the A and B components. Additional information on a single layer organic EL device is disclosed in a copending application entitled "Organic Electroluminescent Device with Continuous Organic Medium", filed on Jul. 15, 1997, bearing the attorney docket number CR97-094, and assigned to the same assignee, which additional information is hereby incorporated by reference.

On top of organic electroluminescent medium 18, a second thin insulating layer 20 is deposited. The thin insulating layer 20 is so selected that it allows the easy tunneling of electrons therethrough, from a second electrode to organic electroluminescent medium 18. At the same time, it also provides a barrier to prevent holes from reaching the second electrode. Generally, insulating layer 20 has a thickness less than 150 Å and preferably less than 50 Å. Insulative layer 16 is formed of an insulative, wide bandgap inorganic or organic material. Examples of materials that can be utilized in the formation of insulating layer 16 are polymethylmethacrylate, polyimide, perfluoropolymers, LiF, AlF3, CaF2, MgF2, diamond, diamond like carbon, SiO2, MgO, $Al_2O_3$, or the like.

Deposited atop insulative layer 20 is a second electrode 22 (cathode) which is typically formed of a metal selected from a group of lithium, magnesium, calcium, or strontium, aluminum, indium, copper, gold, silver, or a combination of the above metals.

One important embodiment of the present invention is directed toward the improvement of the organic EL efficiency as well as control of emission color. The purpose can be achieved by incorporation of a small fraction of a dye or pigment of high fluorescent efficiency into the whole or part of the organic electroluminescent medium 18. For efficient energy transfer, it is necessary that the fluorescent dye or pigment has a bandgap no greater than that of the host material making up organic electroluminescent medium 18. It is preferred that the fluorescent dye or pigment is present in a concentration of from $10^{-3}$ to 10 mole percent, based on the moles of the material forming organic electroluminescent medium 18. The selection of a fluorescent dye or pigment suitable for organic EL application is well known to those skilled in the art.

It should also be noted that insulative layer 16 provides a barrier to carriers tending to move from medium 18 into electrode 14 and insulative layer 20 provides a barrier to carriers tending to move from medium 18 into electrode 22. Thus, carriers are injected easily into medium 18, which is capable of transporting electrons and holes, and the carriers are then transported to recombination sites, which may be the fluorescent dye molecules interspersed in medium 18 or other naturally occurring sites. Since carriers are blocked from leaving medium 18, more recombination occurs, more light is produced and the efficiency of device 10 is improved. Further, since interfaces within device 10 are virtually eliminated device stability is greatly improved.

One variation of the present invention is the omission of one of the two insulative layers 16 or 20. When a single hole transporting material is used as the organic electroluminescent medium in device 10, it is possible to remove insulative layer 16 without compromising the device performance substantially since the mobility of holes in this specific organic electroluminescent medium is much higher than that of electrons. Likewise, when an electron transporting material is used as the organic electroluminescent medium in device 10, it is possible to remove insulative layer 20. The device performance should not be affected significantly due to the higher electron mobility found in medium 20. However, when a bipolar material is used in medium 20, it is preferred that both insulative layers be in place in order to achieve an electroluminescent device with high efficiency.

It should be noted that other variations to the described embodiment are also possible. One particular variation is to add a thermal matching layer between one of the insulative layers 16 or 20 and the organic electroluminescent medium 18 (illustrated generally as a portion of layer 18). The thermal matching layer will have a thermal expansion coefficient between those of the insulative layer (or electrode) and the organic electroluminescent medium. For example, when a tertiary aromatic amine such as 4,4'-bis(N,N'-phenyl-(1-naphthyl)amine)-1,1'-biphenyl (NPB) is used as the organic electroluminescent medium in a device with structure of ITO/$Al_2O_3$/NPB/LiF/Al, it is preferred that a thin thermal matching layer of copper phthalocyanine is inserted between the $Al_2O_3$ and the NPB.

Therefore, a new efficient single layer electroluminescent device is disclosed. Further, the new efficient single layer electroluminescent device is relatively simple to manufacture and has substantially better stability than multi-layer devices. Also, the new efficient single layer electroluminescent device has better reliability than multilayer devices because it has fewer interfaces.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. An electroluminescent device comprising:

a body of small molecule organic material(s) sandwiched between a first electrode and a second electrode;

a layer of first insulative material placed between the body of small molecule organic material and the first electrode, and a layer of second insulative material placed between the body of small molecule organic material and the second electrode;

the body of organic material having a bandgap between 1.5 and 3.5 eV;

the layer of first insulative material having a thickness which allows first carriers from the first electrode to tunnel therethrough and the second insulative material having a thickness which allows second carriers from the second electrode to tunnel therethrough; and the layer of first insulative material providing a barrier to the second carriers and the layer of second insulative material providing a barrier to the first carriers.

2. An electroluminescent device as claimed in claim 1 wherein the single layer of organic material includes hole transporting materials selected from tertiary aromatic amines including

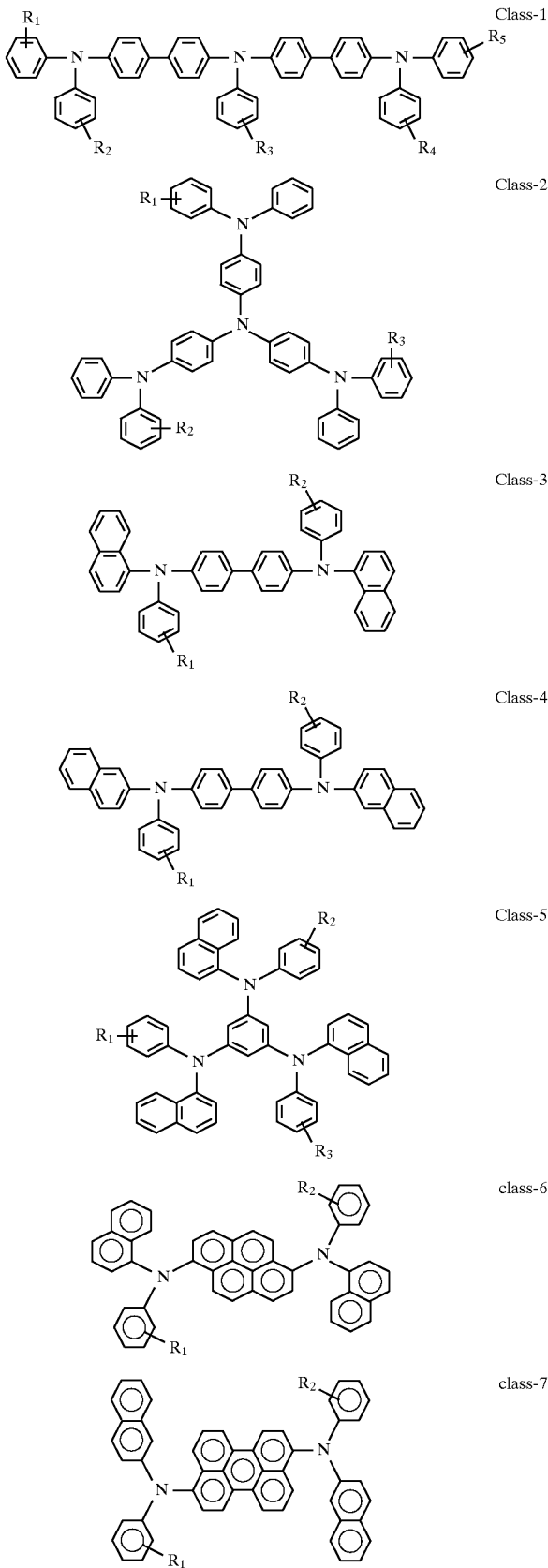

Where $R_1$, $R_2$, $R_3$, $R_4$ and $R_5$ are independently selected from alkyl groups, alkoxy groups, alkylamine groups, aryl groups, aryloxy groups, arylamine groups and halogen; $R_1$, $R_2$, $R_3$, $R_4$ and $R_5$ may also be independently a fused aromatic ring.

3. An electroluminescent device as claimed in claim 1 wherein the single layer of organic material includes electron transporting materials selected from organometallic compounds including tris(8-quinolinol) aluminum, bis(10-oxo-benzo[h] quinoline beryllium, bis(2-(2-oxy-phenyl) benzoxazole) zinc, bis(2-(2-oxy-phenyl)benzothiazole) zinc, Bis(2-methyl-8-quinolinolato)aluminum-$\mu$-oxo-bis(2-methyl-8-quinolinolato)aluminum, Bis(2-methyl-8-quinolinolato)(ortho-cresolato)aluminum.

4. An electroluminescent device as claimed in claim 1 wherein the single layer of organic material includes a continuous organic medium $A_xB_y$, where A is a component capable of transporting electrons, B is a component capable of transporting holes, x represents the content of the A component in the $A_xB_y$ medium with value ranging from 0 to 100%, y represents the content of the B component in the $A_xB_y$ medium with value ranging from 0 to 100%.

5. An electroluminescent device as claimed in claim 1 wherein the single layer of organic material includes a bipolar material that transports both electrons and holes efficiently.

6. An electroluminescent device as claimed in claim 1 wherein the single layer of small molecule material includes a fluorescent dye or pigment in a concentration of from $10^{-3}$ to 10 mole percent, based on the moles of the small molecule organic material in the body.

7. An electroluminescent device as claimed in claim 1 wherein the first electrode includes transparent conductive metal oxides such as indium oxide, indium-tin oxide (ITO), zinc oxide, zinc-tin oxide, transparent conductive polymers such as polyaniline, or semi-transparent thin film of metal selected from gold, copper, silver, and combinations thereof.

8. An electroluminescent device as claimed in claim 1 wherein the second electrode includes a metal selected from lithium, magnesium, calcium, or strontium, aluminum, indium, copper, gold, silver, or a combination thereof.

9. An electroluminescent device as claimed in claim 1 wherein the first layer of insulating material includes organic and inorganic insulative materials with thickness less than 150 Å.

10. An electroluminescent device as claimed in claim 1 wherein the second layer of insulating material includes organic and inorganic insulative materials with thickness less than 150 Å.

11. An electroluminescent device as claimed in claim 1 wherein a thermal matching layer is placed between the first electrode and the body of small molecule organic materials.

12. An electroluminescent device as claimed in claim 1 wherein a thermal matching layer is placed between the second electrode and the body of small molecule organic materials.

13. An electroluminescent device comprising:
 a body of small molecule organic material sandwiched between a first electrode and a second electrode;
 a layer of insulative material placed between the body of small molecule organic material and the first electrode;
 the body of organic material having a bandgap between 1.5 and 3.5 eV; and
 the layer of insulative material having a thickness which allows first carriers from the first electrode to tunnel therethrough and also provides a barrier to the second carriers.

14. An electroluminescent device as claimed in claim 13 wherein the single layer of organic material includes hole transporting materials selected from tertiary aromatic amines including

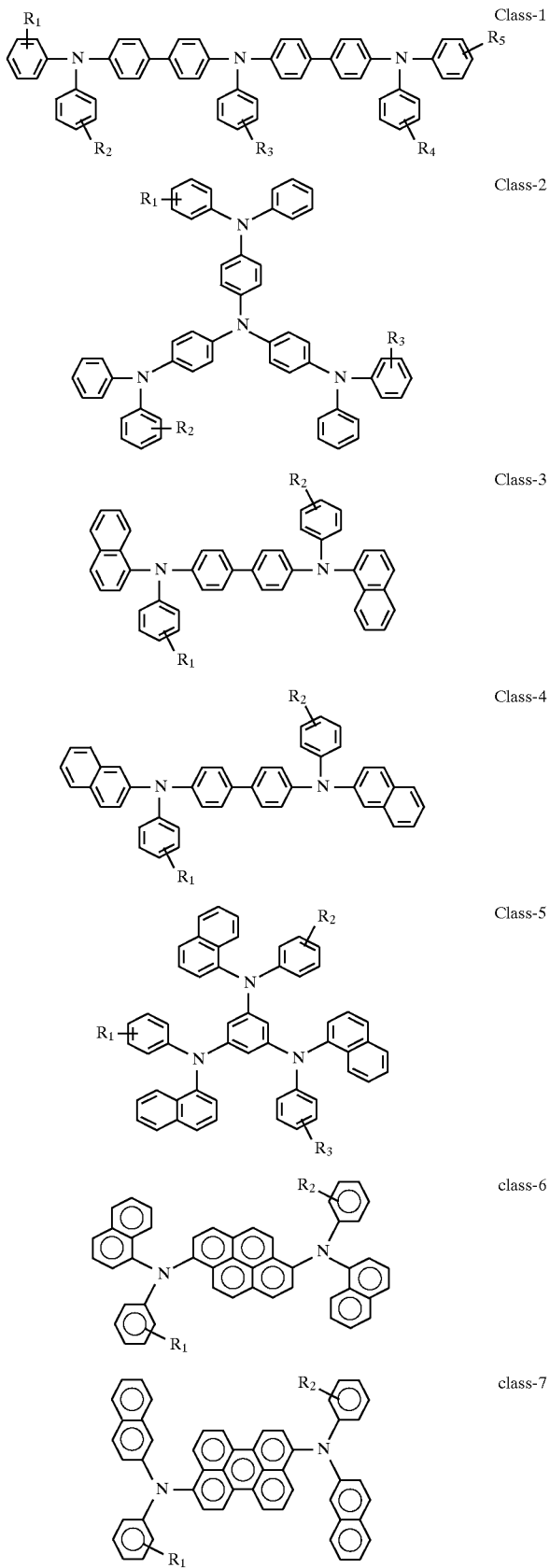

Where $R_1$, $R_2$, $R_3$, $R_4$ and $R_5$ are independently selected from alkyl groups, alkoxy groups, alkylamine groups, aryl groups, aryloxy groups, arylamine groups and halogen; $R_1$, $R_2$, $R_3$, $R_4$ and $R_5$ may also be independently a fused aromatic ring.

15. An electroluminescent device as claimed in claim 13 wherein the single layer of organic material includes electron transporting materials selected from organometallic compounds including tris(8-quinolinol) aluminum, bis(10-oxo-benzo[h] quinoline beryllium, bis(2-(2-oxy-phenyl) benzoxazole) zinc, bis(2-(2-oxy-phenyl)benzothiazole) zinc, Bis(2-methyl-8-quinolinolato)aluminum-μ-oxo-bis(2-methyl- 8-quinolinolato)aluminum, Bis(2-methyl-8-quinolinolato)(ortho-cresolato)aluminum.

16. An electroluminescent device as claimed in claim 13 wherein the single layer of organic material includes a continuous organic medium $A_xB_y$, where A is a component capable of transporting electrons, B is a component capable of transporting holes, x represents the content of the A component in the $A_xB_y$ medium with value ranging from 0 to 100%, and y represents the content of the B component in the $A_xB_y$ medium with value ranging from 0 to 100%.

17. An electroluminescent device as claimed in claim 13 wherein the single layer of organic material includes a bipolar material that transports both electrons and holes efficiently.

18. An electroluminescent device as claimed in claim 13 wherein the single layer of small molecule material includes a fluorescent dye or pigment in a concentration of from $10^{-3}$ to 10 mole percent, based on the moles of the small molecule organic material in the body.

19. An electroluminescent device as claimed in claim 13 wherein the first electrode includes transparent conductive metal oxides such as indium oxide, indium-tin oxide (ITO), zinc oxide, zinc-tin oxide, transparent conductive polymers such as polyaniline, or semi-transparent thin film of metal selected from gold, copper, silver, and combinations thereof.

20. An electroluminescent device as claimed in claim 13 wherein the second electrode includes a metal selected from lithium, magnesium, calcium, or strontium, aluminum, indium, copper, gold, silver, or a combination thereof.

21. An electroluminescent device as claimed in claim 13 wherein the layer of insulating material includes organic and inorganic insulative materials with thickness less than 150 Å.

22. An electroluminescent device as claimed in claim 13 wherein a thermal matching layer is placed between the first electrode and the body of small molecule organic materials.

23. An electroluminescent device as claimed in claim 13 wherein a thermal matching layer is placed between the second electrode and the body of small molecule organic materials.

24. An electroluminescent device comprising:
a body of small molecule organic material having a bandgap between 1.5 and 3.5 eV sandwiched between a first electrode and a second electrode;
a layer of insulative material placed between the body of small molecule organic material and the second electrode; and
the layer of insulative material having a thickness which allows second carriers from the second electrode to tunnel therethrough and also provides a barrier to the first carriers from the first electrode.

25. An electroluminescent device as claimed in claim 24 wherein the single layer of organic material includes hole transporting materials selected from tertiary aromatic amines including

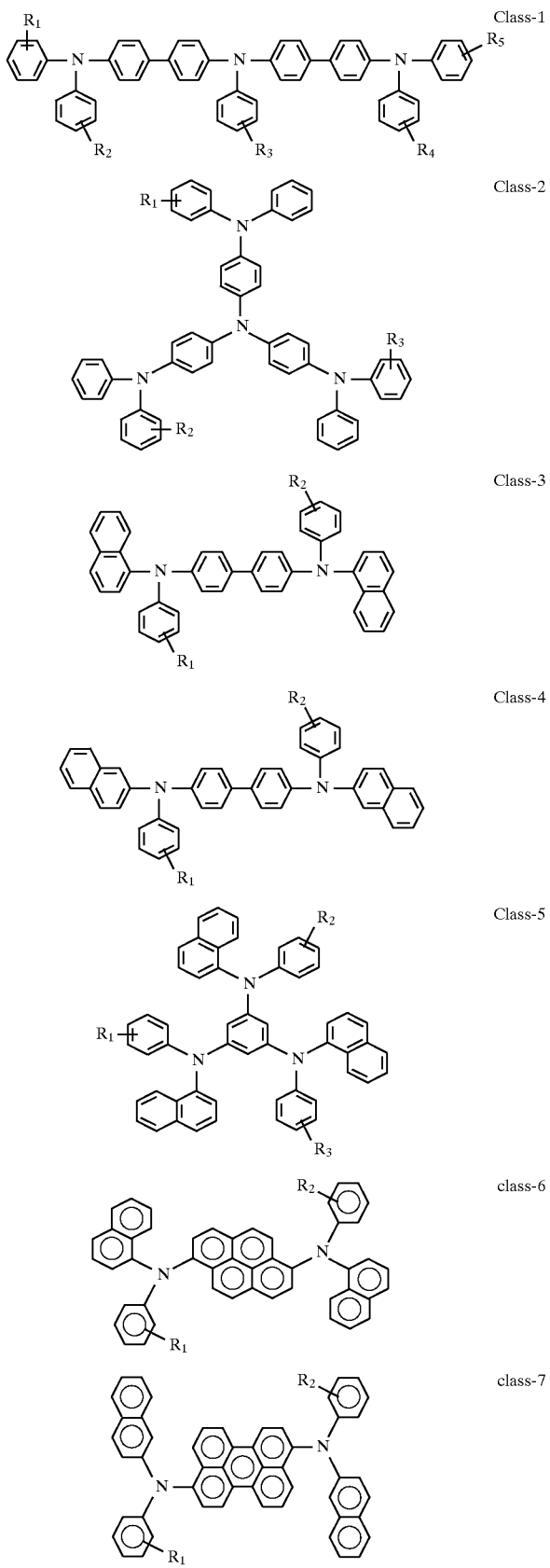

Where $R_1$, $R_2$, $R_3$, $R_4$ and $R_5$ are independently selected from alkyl groups, alkoxy groups, alkylamine groups, aryl groups, aryloxy groups, arylamine groups and halogen; $R_1$, $R_2$, $R_3$, $R_4$ and $R_5$ may also be independently a fused aromatic ring.

26. An electroluminescent device as claimed in claim 24 wherein the single layer of organic material includes electron transporting materials selected from organometallic compounds including tris(8-quinolinol) aluminum, bis(10-oxo-benzo[h] quinoline beryllium, bis(2-(2-oxy-phenyl) benzoxazole) zinc, bis(2-(2-oxy-phenyl)benzothiazole) zinc, Bis(2-methyl-8-quinolinolato)aluminum-$\mu$-oxo-bis(2-methyl- 8-quinolinolato)aluminum, Bis(2-methyl-8-quinolinolato)(ortho-cresolato)aluminum.

27. An electroluminescent device as claimed in claim 24 wherein the single layer of organic material includes a continuous organic medium $A_xB_y$, where A is a component capable of transporting electrons, B is a component capable of transporting holes, x represents the content of the A component in the $A_xB_y$ medium with value ranging from 0 to 100%, and y represents the content of the B component in the $A_xB_y$ medium with value ranging from 0 to 100%.

28. An electroluminescent device as claimed in claim 24 wherein the single layer of organic material includes a bipolar material that transports both electrons and holes efficiently.

29. An electroluminescent device as claimed in claim 24 wherein the single layer of small molecule material includes a fluorescent dye or pigment in a concentration of from $10^{-3}$ to 10 mole percent, based on the moles of the small molecule organic material in the body.

30. An electroluminescent device as claimed in claim 24 wherein the first electrode includes transparent conductive metal oxides such as indium oxide, indium-tin oxide (ITO), zinc oxide, zinc-tin oxide, transparent conductive polymers such as polyaniline, or semi-transparent thin film of metal selected from gold, copper, silver, and combinations thereof.

31. An electroluminescent device as claimed in claim 24 wherein the second electrode includes a metal selected from lithium, magnesium, calcium, or strontium, aluminum, indium, copper, gold, silver, or a combination thereof.

32. An electroluminescent device as claimed in claim 24 wherein the layer of insulating material includes organic and inorganic insulative materials with thickness less than 150 Å.

33. An electroluminescent device as claimed in claim 24 wherein a thermal matching layer is placed between the first electrode and the body of small molecule organic materials.

34. An electroluminescent device as claimed in claim 24 wherein a thermal matching layer is placed between the first electrode and the body of small molecule organic materials.

* * * * *